(12) United States Patent
Kamiya

(10) Patent No.: US 10,347,594 B2
(45) Date of Patent: Jul. 9, 2019

(54) SEMICONDUCTOR DEVICE AND METHOD OF MANUFACTURING SAME

(71) Applicant: TOYOTA JIDOSHA KABUSHIKI KAISHA, Toyota-shi, Aichi-ken (JP)

(72) Inventor: Masayuki Kamiya, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 4 days.

(21) Appl. No.: 15/882,242

(22) Filed: Jan. 29, 2018

(65) Prior Publication Data

US 2018/0226360 A1 Aug. 9, 2018

(30) Foreign Application Priority Data

Feb. 8, 2017 (JP) .................. 2017-021323

(51) Int. Cl.
| | |
|---|---|
| *H01L 23/495* | (2006.01) |
| *H01L 23/00* | (2006.01) |
| *H01L 23/18* | (2006.01) |
| *H01L 23/373* | (2006.01) |
| *H01L 23/522* | (2006.01) |
| *H01L 29/16* | (2006.01) |
| *H01L 23/433* | (2006.01) |
| *H01L 23/31* | (2006.01) |

(52) U.S. Cl.
CPC ............ *H01L 23/562* (2013.01); *H01L 23/18* (2013.01); *H01L 23/3736* (2013.01); *H01L 23/4334* (2013.01); *H01L 23/49513* (2013.01); *H01L 23/49537* (2013.01); *H01L 23/522* (2013.01); *H01L 24/32* (2013.01); *H01L 29/1608* (2013.01); *H01L 23/3107* (2013.01); *H01L 2224/33* (2013.01); *H01L 2224/92247* (2013.01)

(58) Field of Classification Search
CPC ............. H01L 23/562; H01L 23/49537; H01L 23/4334; H01L 23/49513; H01L 24/32; H01L 23/522; H01L 29/1608; H01L 23/18; H01L 23/3736; H01L 23/3107; H01L 2224/33; H01L 2224/92247
See application file for complete search history.

(56) References Cited

U.S. PATENT DOCUMENTS 8,643,185 B2 * 2/2014 Kajiwara .......... H01L 23/49513
257/741

FOREIGN PATENT DOCUMENTS

JP H06-216167 A 8/1994

* cited by examiner

*Primary Examiner* — David Vu
(74) *Attorney, Agent, or Firm* — Oliff PLC

(57) ABSTRACT

A semiconductor device includes a wiring, a semiconductor chip above the wiring and a metal block above the semiconductor chip. The semiconductor chip includes a semiconductor substrate, a lower electrode, an upper large electrode and an upper small electrode. The semiconductor chip includes a first portion and a second portion, the first portion being on an upper small electrode side with respect to a centroid of the semiconductor chip, the second portion being on an opposite side of the upper small electrode with respect to the centroid. The lower electrode is connected to the wiring via a lower solder layer. The lower solder layer includes a solder base material and metal particles. A volume ratio of the metal particles occupying the lower solder layer under the second portion is higher than a volume ratio of the metal particles occupying the lower solder layer under the first portion.

8 Claims, 4 Drawing Sheets

SEMICONDUCTOR DEVICE AND METHOD OF MANUFACTURING SAME

TECHNICAL FIELD

A technology disclosed herein relates to a semiconductor device and a method of manufacturing the same.

DESCRIPTION OF RELATED ART

Japanese Patent Application Publication No. H06 (1994)-216167 discloses a technology of connecting a semiconductor chip and a wiring via a solder layer. In the solder layer, metal particles are distributed, a melting point of the metal particles being higher than a melting point of the solder layer. By distributing the metal particles in the solder layer, a thickness of the solder layer is made uniform.

BRIEF SUMMARY

A semiconductor chip that includes an upper large electrode and an upper small electrode has been known. The upper large electrode and the upper small electrode are provided on an upper surface of the semiconductor chip. The upper small electrode is an electrode in which a small current such as a signal flows, and the upper large electrode is an electrode in which a current larger than the current that flows in the upper small electrode flows. In such a semiconductor chip, there may be a case where a metal block is used as a wiring for the upper large electrode. In a step of manufacturing a semiconductor device of this type, a stacking step of stacking a wiring, a lower solder layer, a semiconductor chip, an upper solder layer, and a metal block in this order is performed. The upper solder layer is arranged on the upper largo electrode, and the metal block is arranged on the upper solder layer. Next, the stack is heated to melt the lower solder layer and the upper solder layer. Thereafter, the stack is cooled to solidify the lower solder layer and the upper solder layer. The wiring, the semiconductor chip, and the metal block are thereby connected mutually.

Since the upper large electrode mid the upper small electrode exist on the upper surface of the semiconductor chip, a position of a center of the upper large electrode is shifted from a position of a center of the upper surface of the semiconductor chip. In the stacking step, the metal block is arranged at approximately the center of the upper large electrode. Accordingly, the metal block is arranged above the semiconductor chip in a state where a position of a centroid of the metal block is shifted from a position of a centroid of the semiconductor chip. Thereafter, when the lower solder layer and the upper solder layer are molten, the semiconductor chip sinks downwardly (toward a lower solder layer) on a centroid side of the metal block. Consequently, the semiconductor chip is tilted with respect to the wiring, and a thickness of the lower solder layer becomes small under the centroid of the metal block. When the semiconductor device is used, a large current flows in the semiconductor chip under the centroid of the metal block (i.e., in a vicinity of a portion under the center of the upper large electrode), and hence a temperature of the semiconductor chip becomes high in this portion. Accordingly, a temperature of the lower solder layer under the centroid of the metal block also becomes high. When the thickness of the lower solder layer under the centroid of the metal block (i.e., a portion a temperature of which becomes high) is small, a crack is likely to occur in the lower solder layer in this portion owing to thermal stress. Even with use of the above-mentioned technology in Japanese Patent Application Publication No. H06-216167, sinking of the semiconductor chip under the centroid of the metal block cannot be suppressed sufficiently.

A semiconductor device disclosed herein may comprise: a wiring; a semiconductor chip arranged above the wiring; and a metal block arranged above the semiconductor chip. The semiconductor chip may include a semiconductor substrate, a lower electrode provided on a lower surface of the semiconductor substrate, an upper large electrode provided on an upper surface of the semiconductor substrate and an upper small electrode provided on the upper surface of the semiconductor substrate, the upper small electrode being smaller than the upper large electrode. The semiconductor chip may include a first portion and a second portion, the first portion being positioned on an upper small electrode side with respect to a centroid of the semiconductor chip along a direction from the upper small electrode toward the upper large electrode, the second portion being positioned on an opposite side of the upper small electrode with respect to the centroid along the direction. A centroid of the metal block may be positioned above the second portion. The lower electrode may be connected to the wiring via a lower solder layer. The upper large electrode may be connected to the metal block via an upper solder layer. The lower solder layer may include a solder base material and metal particles distributed in the solder base material, a melting point of the metal particles being higher than a melting point of the solder base material. A volume ratio of the metal particles occupying the lower solder layer positioned under the second portion may be higher than a volume ratio of the metal particles occupying the lower solder layer positioned under the first portion.

It should be noted that the lower solder layer positioned under the first portion may not include the metal particles. In other words, the volume ratio of the metal particles occupying the lower solder layer positioned under the first portion may be zero.

In this semiconductor device, the centroid of the metal block is positioned above the second portion of the semiconductor chip. Accordingly, a heavier load is applied to the lower solder layer positioned under the second portion of the semiconductor chip than to the lower solder layer positioned under the first portion of the semiconductor chip. Moreover, in this semiconductor device, the volume ratio of the metal particles occupying the lower solder layer positioned under the second portion is higher than the volume ratio of the metal particles occupying the lower solder layer positioned under the first portion. When the base material of the lower solder layer is molten, the metal particles, which have the high melting point, are not molten. Accordingly, in a state where the base material is molten, the lower solder layer that has the high volume ratio of the metal particles (the lower solder layer under the second portion) is less likely to deform than the lower solder layer that has the low volume ratio of the metal particles (the lower solder layer in the first portion). Since the lower solder layer positioned under the second portion, to which a heavy load is applied, is less likely to deform, sinking of the second portion toward the lower solder layer is suppressed. Moreover, since the lower solder layer positioned under the first portion, to which a heavy load is not applied, is more likely to deform, sinking of the first portion toward the lower solder layer is allowed to a certain degree. As such, by allowing sinking of the first portion toward the lower solder layer, sinking of the second portion toward the lower solder layer can be suppressed more effectively. Therefore, in this semiconductor device, a decrease in thickness of the lower solder layer under the second portion can be suppressed. A crack in the lower solder layer is thereby suppressed.

DETAILED DESCRIPTION OF INVENTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor device, as well as methods for manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 1:
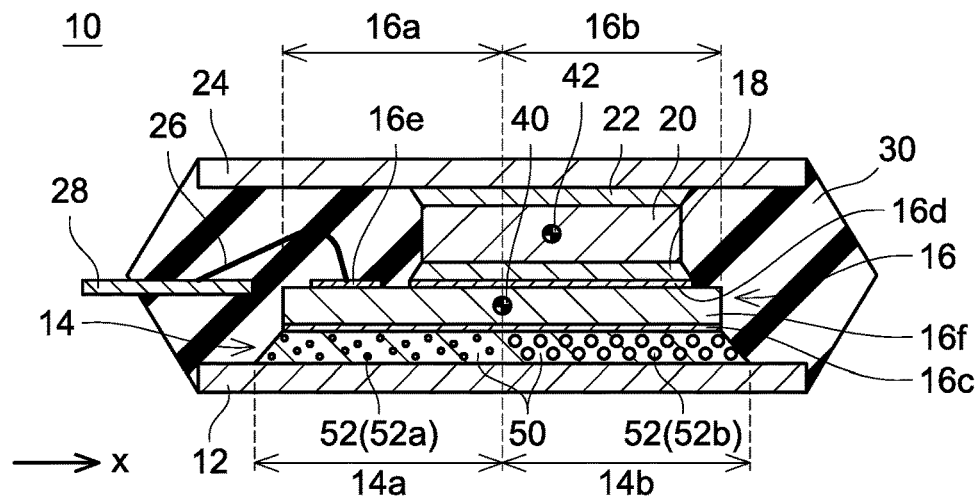
FIG. 1 shows a vertical cross-sectional view of a semiconductor device 10.

A semiconductor device 10 in an embodiment shown in FIG. 1 comprises a lead frame 12, a semiconductor chip 16, a copper block 20, a lead frame 24, a lead wire 28, and an insulating resin 30.

The lead frame 12 is a wiring constituted of a metal.

Figure 2:
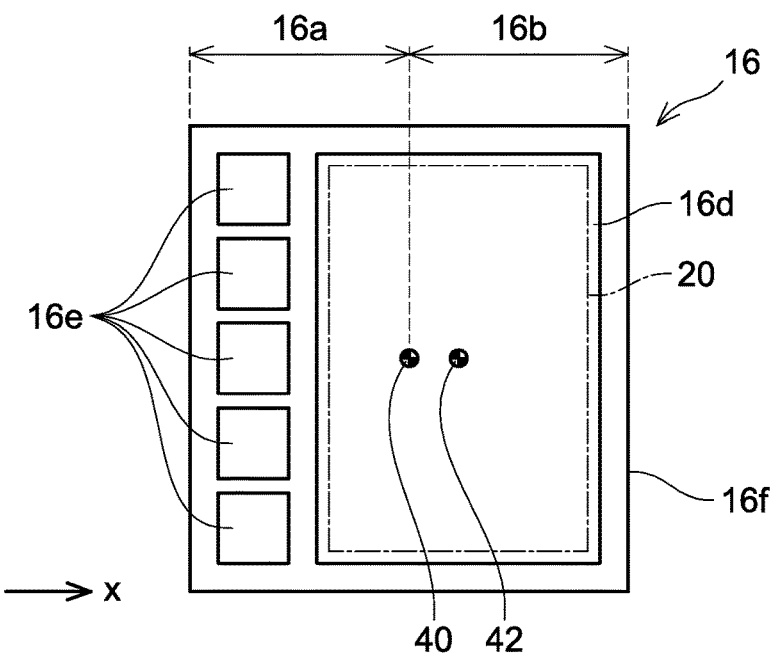
FIG. 2 shows a plan view of a semiconductor chip 16.

The semiconductor chip 16 is arranged above the lead frame 12. The semiconductor chip 16 includes a semiconductor substrate 16f, a lower electrode 16c, an upper large electrode 16d, and a plurality of upper small electrodes 16e. The semiconductor substrate 16f is a SiC substrate that mainly constituted of SiC (silicon carbide). A MOSFET (a metal oxide semiconductor field effect transistor) or the like is provided inside the semiconductor substrate 16f. The lower electrode 16c covers approximately an entire range of a lower surface of the semiconductor substrate 16f. A lower solder layer 14 is arranged between the lower electrode 16c and the lead frame 12. The lower electrode 16c is connected to the lead frame 12 via the lower solder layer 14. As shown in FIG. 2, the upper large electrode 16d and the plurality of upper small electrodes 16e are provided on an upper surface of the semiconductor substrate 16f. The upper large electrode 16d is larger than each of the upper small electrodes 16e. The upper small electrodes 16e include a gate electrode of the MOSFET and an electrode for measuring currents, temperatures, and the like of the semiconductor substrate 161. A current that flows in each of the upper small electrodes 16e is small. A principal current of the MOSFET flows between the upper large electrode 16d and the lower electrode 16c. The principal current of the MOSFET is larger than the current that flows in each of the upper small electrodes 16e. The plurality of upper small electrodes 16e are disposed along one side of the upper surface of the semiconductor substrate 16f. The upper large electrode 16d is arranged at a position adjacent to the plurality of upper small electrodes 16e.

As shown in FIG. 1, the copper block 20 is arranged above the upper large electrode 16d. An upper solder layer 18 is arranged between the copper block 20 and the upper large electrode 16d. The copper block 20 is connected to the upper large electrode 16d via the upper solder layer 18.

The lead frame 24 is a wiring constituted of a metal. The lead frame 24 is arranged above the copper block 20. A solder layer 22 is arranged between the lead frame 24 and the copper block 20. The lead frame 24 is connected to the copper block 20 via the solder layer 22.

The lead wire 28 is arranged laterally to the semiconductor chip 16. Although not shown, a number of the lead wires 28 are arranged laterally to the semiconductor chip 16, the number corresponding to a number of the plurality of upper small electrodes 16e. Each of the upper small electrodes 16e is connected to corresponding one of the lead wires 28 via wires 26.

The insulating resin 30 covers a surface of each member positioned between the lead frame 12 and the lead frame 24.

In FIGS. 1 and 2, a centroid 40 indicates a centroid of the semiconductor chip 16, and a centroid 42 indicates a centroid of the copper block 20. Moreover, FIG. 2 shows a position of the copper block 20 by a dot-and-dash line. As shown in FIG. 2, the centroid 40 of the semiconductor chip 16 is positioned at approximately a center of the semiconductor chip 16 when the semiconductor chip 16 is seen from above, in the following, along a direction from the upper small electrode 16e toward the upper large electrode 16d (an x direction in FIGS. 1 and 2), a portion of the semiconductor chip 16 positioned on an upper small electrode 16c side with respect to the centroid 40 is referred to as a first portion 16a. Moreover, a portion of the semiconductor chip 16 positioned on an opposite side of the upper small electrode 16e with respect to the centroid 40 is referred to as a second portion 16b. As mentioned above, the principal current of the MOSFET flows between the upper large electrode 16d and the lower electrode 16c. As shown in FIG. 2, most part of the upper large electrode 16d is positioned in the second portion 16b of the semiconductor chip 16. Accordingly, most part of the principal current flows in the second portion 16b of the semiconductor chip 16. Therefore, when the semiconductor device 10 operates, a temperature of the second portion 16b becomes higher than a temperature of the first portion 16a.

As shown in FIG. 2, the copper block 20 is arranged immediately above the upper large electrode 16d. Accordingly, when the semiconductor chip 16 is seen from above, the centroid 42 of the copper block 20 is positioned at approximately a center of the upper large electrode 16d. A position of the center of the upper large electrode 16d is shifted from a position of the center of the semiconductor chip 16. Therefore, when the semiconductor chip 16 is seen from above, a position of the centroid 42 of the copper block 20 is shifted from a position of the centroid 40 of the semiconductor chip 16. The centroid 42 of the copper block 20 is arranged above the second portion 16b of the semiconductor chip 16. Therefore, most part of a load of the copper block 20 is applied to the second portion 16b of the semiconductor chip 16.

As shown in FIG. 1, the lower solder layer 14 includes a base material 50 constituted of solder, and metal particles 52 distributed inside the base material 50. The metal particles 52 are constituted of a metal that has a melting point higher than a melting point of the base material 50. In the present embodiment, the metal particles 52 are constituted of nickel. The metal particles 52 are particles having approximately a spherical shape. The lower solder layer 14 includes a first area 14a that includes metal particles 52a having a small diameter, and a second area 14b that includes metal particles 52b having a large diameter. In other words, an average diameter of the metal particles 52 in the second area 14b is larger than an average diameter of the metal particles 52 in the first area 14a. A volume ratio of the metal particles 52 occupying the second area 14b is higher than a volume ratio of the metal particles 52 occupying the first area 14a. The first area 14a is arranged under the first portion 16a of the semiconductor chip 16, and the second area 14b is arranged under the second portion 16b of the semiconductor chip 16. In the x direction, a position of a border between the first portion 16a and the second portion 16b of the semiconductor chip 16 (i.e., the position of the centroid 40) approximately coincides with a position of a border between the first area 14a and the second area 14b of the lower solder layer 14.

Figure 3:
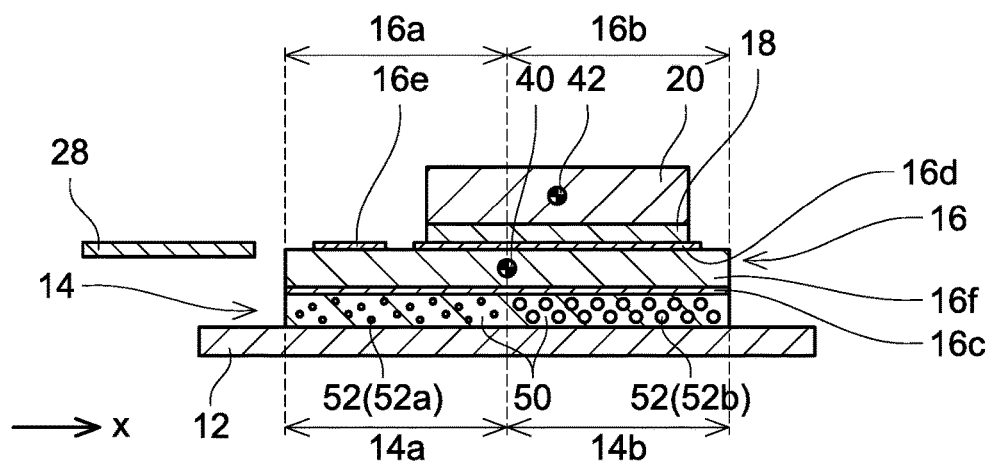
FIG. 3 shows an explanatory diagram of a step of manufacturing the semiconductor device 10.

Next, a method of manufacturing the semiconductor device 10 will be described. Firstly, as shown in FIG. 3, a lead frame 12, a lower solder layer 14, a semiconductor chip 16, an upper solder layer 18, and a copper block 20 are stacked. More specifically, a laminate-like component that configures the lower solder layer 14 is placed on the lead frame 12. It should be noted that the lower solder layer 14 may be constituted of one laminate-like; component, or the first area 14a and the second area 14b may be constituted of separate, distinct components, respectively. Moreover, the semiconductor chip 16 is placed on the lower solder layer 14. Here, the lower electrode 16c is brought into contact with the lower solder layer 14. Moreover, the semiconductor chip 16 is placed such that a first portion 16a of the semiconductor chip 16 is positioned on a first area 14a of the lower solder layer 14 and a second portion 16b of the semiconductor chip 16 is positioned on a second area 14b of the lower solder layer 14. Moreover, a laminate-like component that configures the upper solder layer 18 is placed on an upper large electrode 16d. Moreover, the copper block 20 is placed on the upper solder layer 18. Here, the copper block 20 is placed such that a centroid 42 of the copper block 20 is positioned above the second portion 16b of the semiconductor chip 16. At this time point, each of the lower solder layer 14 and the upper solder layer 18 is not joined to its adjacent member yet. Moreover, at this time point, the lead frame 12 is linked to a lead wire 28 at a position not shown.

Next, a stack shown in FIG. 3 is heated. More specifically, the stack is heated up to a temperature higher than a melting point of a base material 50 of the lower solder layer 14 and lower than a melting point of metal particles 52, to thereby melt the base material 50. Moreover, the upper solder layer 18 is also molten. Thereafter, the stack is cooled, and the base material 50 of the lower solder layer 14 and the upper solder layer 18 are solidified. The lead frame 12 and the lower electrode 16c are thereby joined to each other via the lower solder layer 14, and the upper large electrode 16d and the copper block 20 are thereby joined to each other via the upper solder layer 18.

The lower solder layer 14 while the stack is being heated will be described in further details. As shown in FIG. 3, the centroid 42 of the copper block 20 is positioned above the second portion 16b of the semiconductor chip 16. Accordingly, a heavier load is applied to the second portion 16b than to the first portion 16a. Consequently, a moment acts on the semiconductor chip 16 along a direction in which the second portion 16b moves downwardly around its centroid 40. Accordingly, a heavier load is applied to the second area 14b positioned under the second portion 16b than to the first area 14a positioned under the first portion 16a.

On the other hand, when the stack is heated, the base material 50 of the lower solder layer 14 is molten. At this time, the metal particles 52 inside the lower solder layer 14 are not molten. The volume ratio of the metal particles 52, which are not molten, is higher in the second area 14b than in the first area. 14a. Therefore, in a state where the base material 50 is molten, a viscosity of the second area 14b is higher than a viscosity of the first area 14a. Accordingly, in a state where the base material 50 is molten, the second area 14b is less likely to deform (fluidize), and the first area 14a is more likely to deform. The second area 14b is less likely to deform, and hence even though a heavy load is applied to the second area 14b, sinking of the second portion 16b of the semiconductor chip 16 toward the lower solder layer 14 is suppressed. Moreover, the first area 14a is more likely to deform, and hence even though the load applied to the first area 14a is light, the first portion 16a of the semiconductor chip 16 sinks toward the lower solder layer 14 to a certain degree. Sinking of the first portion 16a is allowed, and thereby sinking of the second portion 16b is effectively suppressed. Accordingly, a decrease in thickness of the lower solder layer 14 under the second portion 16b (i.e., the second area 14b) is suppressed. Thereafter, when the stack is cooled to solidify the lower solder layer 14, the lower solder layer 14 that has a sufficient thickness under the second portion 16b is obtained. As mentioned above, when the semiconductor device 10 is used, the temperature of the second portion 16b of the semiconductor chip 16 becomes high. Accordingly, a temperature of the lower solder layer 14 under the second portion 16b (i.e., the second area 14b) also becomes high. When the second area 14b has a large thickness, the second area 14b is likely to elastically deform in accordance with thermal stress. Accordingly, even though the temperature of the second area 14b becomes high, a crack suppressed from occurring in the second area 14b.

It should be noted that by adjusting a diameter of the metal particles 52 in each of the first area 14a and the second area 14b of the lower solder layer 14, an amount of sinking of the first portion 16a of the semiconductor chip 16 and an amount of sinking of the second portion 16b of the semiconductor chip 16 may be approximately equalized. By equalizing the amount of sinking of the first portion 16a and the amount of sinking of the second portion 16b, the thickness of the lower solder layer 14 is made uniform, and a crack in the lower solder layer 14 can be suppressed more effectively.

Moreover, the amount of sinking of the first portion 16a may be larger than the amount of sinking of the second portion 16b. In this case, a thickness of the first area 14a of the lower solder layer 14 becomes smaller than the thickness of the second area 14b of the lower solder layer 14. In such a configuration as well, the thickness of the second area 14b becomes large, and hence a crack in the second area 14b can be suppressed. Moreover, as mentioned above, since the temperature of the first portion 16a of the semiconductor chip 16 is less likely to become high, a temperature of the first area 14a of the lower solder layer 14 is also less likely to become high. Therefore, even though the thickness of the first area 14a is small, a crack is less likely to occur in the first area 14a.

Once the lower solder layer 14 and the upper solder layer 18 are solidified, each of the upper small electrodes 16e is connected to the corresponding lead wire 28 via a wire 26. Next, the copper block 20 is connected to the lead frame 24 via the solder layer 22. Next, the insulating resin 30 is formed by injection molding. Thereafter, each of the lead frame 12 and the lead wire 28 is cut into a desired shape, and the semiconductor device 10 shown in FIG. 1 is thereby completed.

As described above, in the semiconductor device 10 in the present embodiment the lower solder layer 14 under the second portion 16b of the semiconductor chip 16 (i.e., the second area 14b) is less likely to deform when the lower solder layer 14 is molten. Due to this, sinking of the second portion 16b is suppressed even though a heavy load is applied to the second area 14b. Furthermore, the lower solder layer 14 under the first portion 16a of the semiconductor chip 16 (i.e., the first area 14a) is more likely to deform when the lower solder layer 14 is molten. This allows sinking of the first portion 16a to a certain degree. By allowing sinking of the first portion 16a, sinking of the second portion 16b is further suppressed. Therefore, according to this technology, the thickness of the second area 14b can be ensured, and a crack can be suppressed from occurring in the second area 14b.

Figure 4:
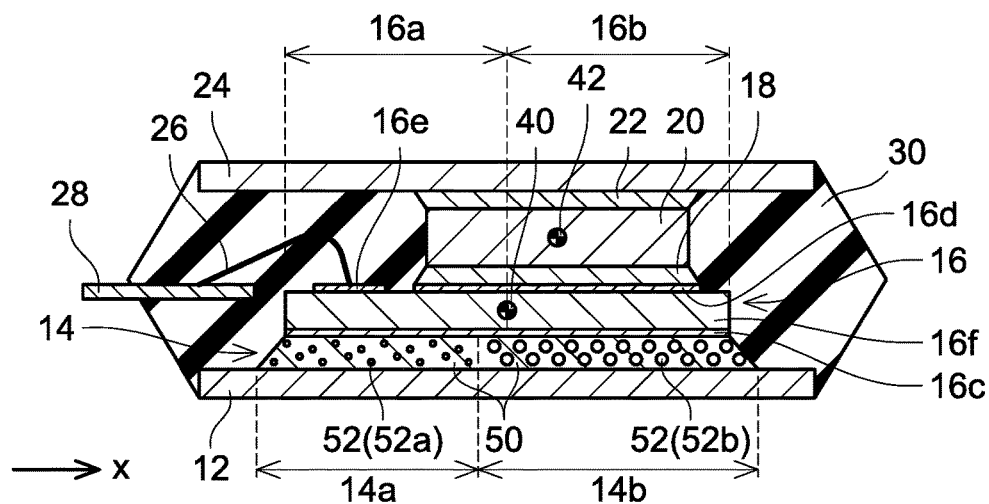
FIG. 4 shows a vertical cross-sectional view of a semiconductor device in a variation.
Figure 5:
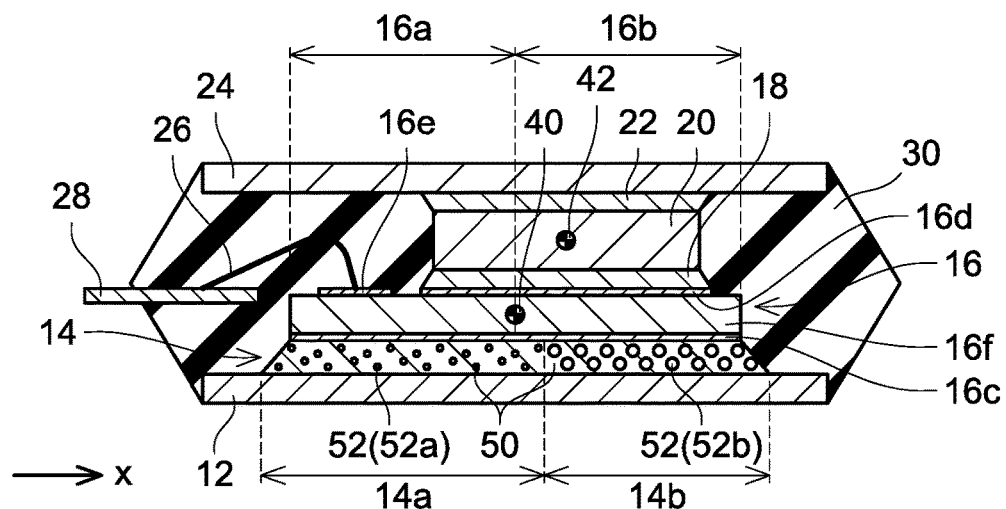
FIG. 5 shows a vertical cross-sectional view of a semiconductor device in a variation.
Figure 6:
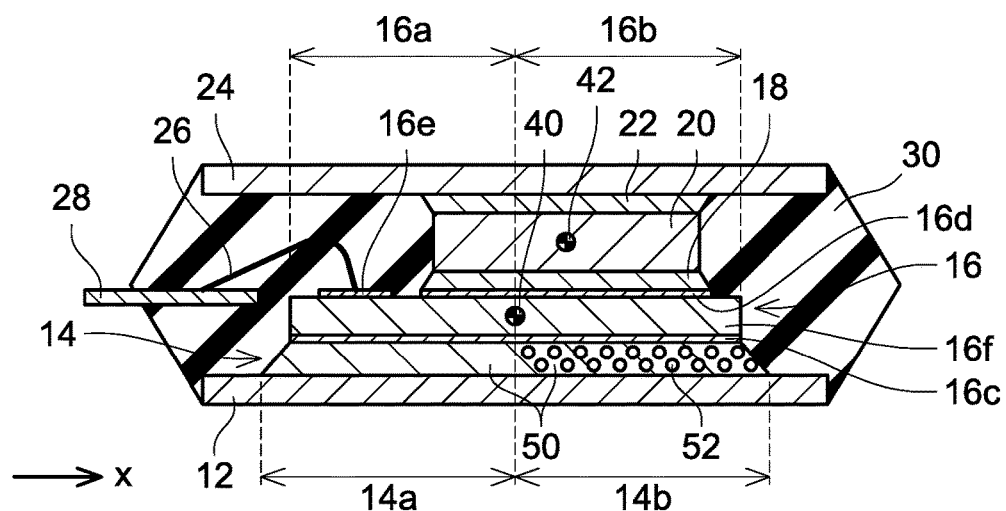
FIG. 6 shows a vertical cross-sectional view of a semiconductor device in a variation.
Figure 7:
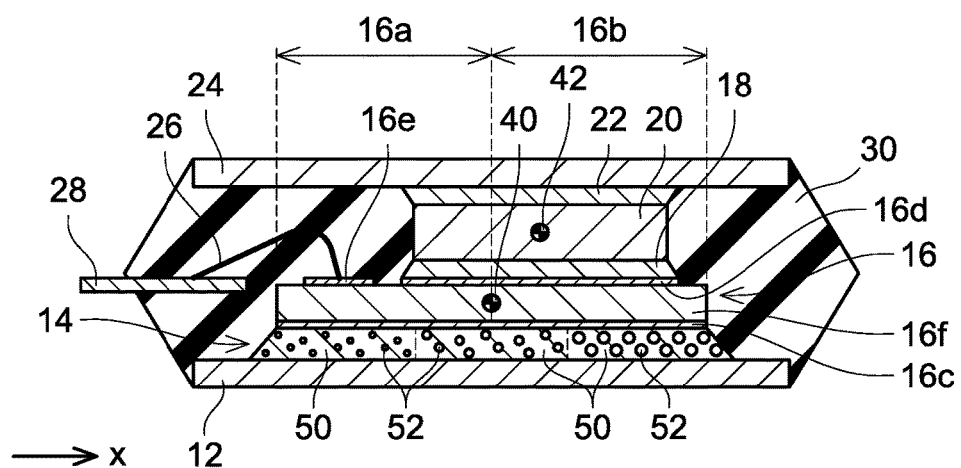
FIG. 7 shows a vertical cross-sectional view of a semiconductor device in a variation.

It should be noted that in the embodiment mentioned above, the position of the border between the first area 14a and the second area 14b of the lower solder layer 14 approximately coincides with the position of the border between the first portion 16a and the second portion 16b of the semiconductor chip 16. However, as shown in FIGS. 4 and 5, the positions of these borders may be shifted from each other. In these configurations as well, the volume ratio of the metal particles 52 inside the lower solder layer 14 is higher under the second portion 16b of the semiconductor chip 16 than under the first portion 16a of the semiconductor chip 16, and hence sinking of the second portion 16b can be suppressed. Moreover, in the embodiment mentioned above, the first area 14a of the lower solder layer 14 includes the metal, particles 52. However, as shown in FIG. 6, the first area 14a may not include the metal particles 52. Moreover, as shown in FIG. 7, the diameter of the metal particles 52 may change in three steps. Moreover, the diameter of the metal particles 52 may change in a larger number of steps than the number of stages in FIG. 7. Moreover, the diameter of the metal particles 52 may be increased gradually from an end portion on a first portion 16a side toward an end portion on a second portion 16b side. Moreover, the metal particles 52 that have different diameters may be distributed in a mixed state in the lower solder layer 14, and the average diameter of the metal particles 52 under the second portion 16b may be larger than the average diameter of the metal particles 52 under the first portion 16a. Moreover, a configuration made by combining these variations may be adopted.

Moreover, in the embodiment mentioned above, the metal particles 52 have approximately a spherical shape. However, the metal particles 52 may have another shape (e.g., a cylindrical shape, a cubic shape, a rectangular parallelepiped shape, or the like). If the metal particles 52 have a cylindrical shape, its axis may extend along a vertical direction (a thickness direction of the lower solder layer 14), or may extend along a transverse direction (a direction orthogonal to the vertical direction), or may extend along another direction.

Moreover, in the embodiment mentioned above, the metal particles 52 are constituted of nickel. However, the metal particles 52 may be constituted of any material as long as the material enables the metal particles 52 to maintain their shape at the melting point of the base material 50. For example, the metal particles 52 may be constituted of copper, a resin, glass, or the like.

Some of the features characteristic to below-described embodiments will herein be listed. It should be noted that the respective technical elements are independent of one another, and are useful.

In one aspect of the present teachings, the lower solder layer positioned under the second portion and the lower solder layer positioned under the first portion may include the metal particles respectively, and an average diameter of the metal particles in the lower solder layer positioned under the second portion may be larger than an average diameter of the metal particles in the lower solder layer being positioned under the first portion.

In one aspect of the present teachings, the lower solder layer may include a first area and a second area, a diameter of the metal particles included in the second area may be larger than a diameter of the metal particles included in the first area, the first area may be positioned under the first portion, and the second area may be positioned under the second portion.

According to these configurations, a decrease in thickness of the lower solder layer under the second portion can be suppressed effectively.

In one aspect of the present teachings, the semiconductor substrate may be a SiC substrate.

The SiC substrate is used at a high current density. Accordingly, in the SiC substrate, a size of the upper large electrode is small. Accordingly; compared with another semiconductor substrate (e.g., a silicon substrate) or the like, a ratio of the size of the upper large electrode with respect to a size of one of the upper small electrodes is small. Accordingly, a center of the upper large electrode tends to be arranged at a position significantly shifted from a center of the semiconductor substrate. Accordingly, in the SiC substrate, a problem of sinking of the second portion is likely to occur. Therefore, the technology disclosed in the present specification is more effective for the semiconductor device that includes the SiC substrate.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
   a wiring;
   a semiconductor chip arranged above the wiring; and
   a metal block arranged above the semiconductor chip, wherein
   the semiconductor chip includes:
   a semiconductor substrate;
   a lower electrode provided on a lower surface of the semiconductor substrate;
   an upper large electrode provided on an upper surface of the semiconductor substrate; and
   an upper small electrode provided on the upper surface of the semiconductor substrate, the upper small electrode being smaller than the upper large electrode,
   the semiconductor chip includes a first portion and a second portion, the first portion being positioned on an upper small electrode side with respect to a centroid of the semiconductor chip along a direction from the upper small electrode toward the upper large electrode, the second portion being positioned on an opposite side of the upper small electrode with respect to the centroid along the direction,
   a centroid of the metal block is positioned above the second portion,
   the lower electrode is connected to the wiring via a lower solder layer,
   the upper large electrode is connected to the metal block via an upper solder layer,
   the lower solder layer includes a solder base material and metal particles distributed in the solder base material, a melting point of the metal particles being higher than a melting point of the solder base material, and
   a volume ratio of the metal particles occupying the lower solder layer positioned under the second portion is higher than a volume ratio of the metal particles occupying the lower solder layer positioned under the first portion.

2. The semiconductor device as in claim 1, wherein
   the lower solder layer positioned under the second portion and the lower solder layer positioned under the first portion include the metal particles respectively, and
   an average diameter of the metal particles in the lower solder layer positioned under the second portion is larger than an average diameter of the metal particles in the lower solder layer positioned under the first portion.

3. The semiconductor device as in claim 2, wherein
   the lower solder layer includes a first area and a second area,
   a diameter of the metal particles included in the second area is larger than a diameter of metal particles included in the first area,
   the first area is positioned under the first portion, and
   the second area is positioned under the second portion.

4. The semiconductor device as in claim 1, wherein
   the semiconductor substrate is a SiC substrate.

5. A method of manufacturing a semiconductor device comprising:
   forming a stack by stacking a wiring, a lower solder layer, a semiconductor chip, an upper solder layer, and a metal block; and
   heating the stack,
   wherein
   the semiconductor chip includes:
   a semiconductor substrate;
   a lower electrode provided on a lower surface of the semiconductor substrate;
   an upper large electrode provided on an upper surface of the semiconductor substrate; and
   an upper small electrode provided on the upper surface of the semiconductor substrate, the upper small electrode being smaller than the upper large electrode, and
   the semiconductor chip includes a first portion and a second portion, the first portion being positioned on an upper small electrode side with respect to a centroid of the semiconductor chip along a direction from the upper small electrode toward the upper large electrode, the second portion being positioned on an opposite side of the upper small electrode with respect to the centroid along the direction,
   the lower solder layer includes a solder base material and metal particles distributed in the solder base material, a melting point of the metal particles being higher than a melting point of the solder base material,
   the forming of the stack includes:
   arranging the lower solder layer on the wiring;
   arranging the lower electrode on the lower solder layer;
   arranging the upper solder layer on the upper large electrode; and
   arranging the metal block on the upper solder layer,
   in the forming of the stack, the wiring, the lower solder layer, the semiconductor chip, the upper solder layer, and the metal block are stacked such that:
   a centroid of the metal block is arranged above the second portion; and
   a volume ratio of the metal particles occupying the lower solder layer positioned under the second portion is higher than a volume ratio of the metal particles occupying the lower solder layer positioned under the first portion, and
   the heating of the stack includes: melting the lower solder layer and the upper solder layer; and thereafter solidifying the lower solder layer and the upper solder layer.

6. The method as in claim 5, wherein
   the lower solder layer positioned under the first portion and the lower solder layer positioned under the second portion include the metal particles respectively, and
   the forming of the stack includes stacking such that an average diameter of the metal particles in the lower solder layer positioned under the second portion is larger than an average diameter of the metal particles in the lower solder layer positioned under the first portion.

7. The method as in claim 6, wherein
   the lower solder layer includes a first area and a second area,
   a diameter of the metal particles included in the second area is larger than a diameter of the metal particles included in the first area, and
   the forming of the stack includes stacking such that the first area is positioned under the first portion and the second area is positioned under the second portion.

8. The method as in claim 5, wherein
   the semiconductor substrate is a SiC substrate.

* * * * *